(12) United States Patent
Lim

(10) Patent No.: US 7,385,427 B2
(45) Date of Patent: Jun. 10, 2008

(54) SAMPLE-AND-HOLD CIRCUITS HAVING REDUCED CHANNEL CONDUCTANCE VARIATION AND METHODS OF OPERATION THEREOF

(75) Inventor: Sung-Sang Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 11/443,730

(22) Filed: May 31, 2006

(65) Prior Publication Data

US 2007/0013417 A1  Jan. 18, 2007

(30) Foreign Application Priority Data

Jul. 14, 2005 (KR) .................. 10-2005-0063902

(51) Int. Cl.
*H03K 5/00* (2006.01)

(52) U.S. Cl. .................. 327/92; 327/93; 327/94; 327/95

(58) Field of Classification Search .............. None
See application file for complete search history.

(56) References Cited

U.S. PATENT DOCUMENTS

| | | | | |
|---|---|---|---|---|
| 5,982,426 | A * | 11/1999 | Kimura .................. | 348/241 |
| 6,016,067 | A | 1/2000 | Vulih et al. ................ | 327/94 |
| 6,069,502 | A | 5/2000 | Preslar et al. .............. | 327/94 |
| 6,255,865 | B1 * | 7/2001 | Opris ...................... | 327/94 |
| 6,323,697 | B1 * | 11/2001 | Pavan ...................... | 327/94 |
| 6,545,776 | B1 * | 4/2003 | Machida et al. .......... | 358/482 |
| 7,183,814 | B2 * | 2/2007 | Kudo ...................... | 327/91 |
| 2004/0070439 | A1 * | 4/2004 | Sarraj ...................... | 327/337 |

FOREIGN PATENT DOCUMENTS

| | | |
|---|---|---|
| JP | 2000-114895 | 4/2000 |
| JP | 2000-132989 | 5/2000 |
| JP | 2000-134097 | 5/2000 |
| JP | 2001-110195 | 4/2001 |

OTHER PUBLICATIONS

Notice to Submit Response corresponding to Korean Patent Application No. 10-2005-0063902 mailed Oct. 23, 2006.

* cited by examiner

*Primary Examiner*—Tuan T Lam
*Assistant Examiner*—Hiep Nguyen
(74) *Attorney, Agent, or Firm*—Myers Bigel Sibley & Sajovec, PA (57) ABSTRACT

An electronic device, such as a sample-and-hold circuit, includes a field effect transistor (FET), a capacitor, and a voltage offset circuit. The FET is configured to receive a signal at a first terminal thereof and selectively provide the signal to a second terminal thereof responsive to a switching signal at a gate terminal thereof. The capacitor is electrically connected to the second terminal of the FET. The voltage offset circuit is electrically connected to the first terminal and the gate terminal of the FET. The voltage offset circuit is configured to maintain a substantially constant voltage differential between the first terminal and the gate terminal of the FET while the signal is provided to the second terminal of the FET and substantially independent of a voltage level of an input signal. Related methods of operation are also discussed.

15 Claims, 5 Drawing Sheets

SAMPLE-AND-HOLD CIRCUITS HAVING REDUCED CHANNEL CONDUCTANCE VARIATION AND METHODS OF OPERATION THEREOF

CROSS-REFERENCE TO RELATED APPLICATIONS

This application claims priority under 35 U.S.C. § 119(a) from Korean Patent Application No. 10-2005-0063902 filed on Jul. 14, 2005, the disclosure of which is incorporated by reference herein in its entirety.

FIELD OF THE INVENTION

The present invention relates to sample-and-hold circuits that may be used in the front end of an analog-to-digital (A/D) converter and related methods of operation.

BACKGROUND OF THE INVENTION

A track-and-hold circuit, or sample-and-hold circuit, is a type of circuit that may typically be used in a front end of an analog-to-digital (A/D) converter to sample a continuously varying signal in discrete time intervals. A conventional track-and-hold circuit may typically include a switch and a capacitor. As such, a conventional track-and-hold circuit may exhibit considerable channel charge injection and/or variation in channel conductance, both of which may be dependent on the gate-source voltage and/or the threshold voltage of the switch in the track-and-hold circuit.

Figure 1:
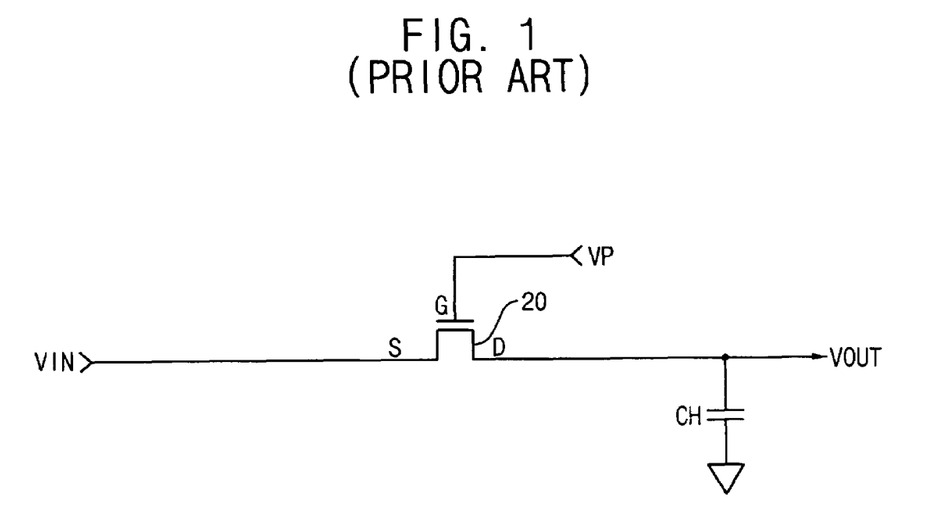
FIG. 1 is a circuit diagram illustrating a conventional track-and-hold circuit.

FIG. 1 is a circuit diagram illustrating a conventional track-and-hold circuit. Referring to FIG. 1, a n-channel metal-oxide semiconductor (NMOS) transistor 20 functioning as a switch includes a gate terminal to which a pulse signal VP having a given period is applied, a source terminal to which an analog input signal VIN is applied, and a drain terminal coupled to a hold capacitor CH. The track-and-hold circuit may function in a track mode operation and a hold mode operation. In track mode operation, the NMOS transistor 20 is turned on in response to applying the pulse signal VP at a logic 'high' level, and the hold capacitor CH is electrically charged. In hold mode operation, the NMOS transistor 20 is turned off in response to applying the pulse signal VP at a logic 'low' level, and the hold capacitor CH holds the stored electric charges.

When the NMOS transistor 20 transitions from a turned-on (i.e., conducting) state to a turned-off (i.e., non-conducting) state, electric charges, which may be deposited in a channel region under the gate of the NMOS transistor 20, may be released either to the input voltage terminal or to the hold capacitor CH, with equal likelihood. As such, about a half of the released charges may be transferred to the hold capacitor CH. The formula $(1/2) \times (C_{OX} \times W \times L) \times (V_{gs} - V_{th})$ may be used to describe the charges transferred to the hold capacitor CH, where $C_{OX}$ denotes capacitance per unit area of a gate oxide layer, W denotes a width of the gate, L denotes a length of the gate, $V_{gs}$ denotes a voltage between the gate terminal and the source terminal, and $V_{th}$ denotes the threshold voltage of the NMOS transistor 20.

A channel voltage $V_{ch}$ across the channel of the NMOS transistor 20 may be represented by:

$$V_{ch} = -((C_{OX} \times W \times L)/(2 \times C_{hold})) \times (V_{gs} - V_{th}) \quad \text{Equation 1}$$

wherein $C_{hold}$ denotes a capacitance of the hold capacitor CH.

When the input signal VIN is a sine wave $A\sin(\omega t)$, the gate-source voltage $V_{gs}$ may be represented by the formula $V_{gs} = VP - A\sin(\omega t)$, wherein A denotes a voltage amplitude of the input signal VIN. A change in the gate-source voltage $\Delta V_{gs}$ may be represented by:

$$\Delta V_{gs} = A \sin(\omega t) \quad \text{Equation 2}$$

The threshold voltage $V_{th}$ may be represented by:

$$V_{th} = V_{tho} + \Gamma \times [(2\phi_F + V_{SB})^{1/2} - (2\phi_F)^{1/2}] \quad \text{Equation 3}$$

wherein $V_{tho}$ denotes an initial threshold voltage, $\phi_F$ denotes a work function, $V_{SB}$ denotes a voltage between the source and a body of the transistor, and $\Gamma$ denotes $(2q\epsilon_S N_{SUB})^{1/2}/C_{OX}$, wherein q denotes an amount of electric charge of an electron, $\epsilon_S$ denotes a permittivity of silicon, and $N_{SUB}$ denotes a doping concentration of a substrate (or the body).

A change in the threshold voltage $\Delta V_{gs}$ may be represented by:

$$\Delta V_{th} = \Gamma \times [A \sin(\omega t)]^{1/2} \quad \text{Equation 4}$$

Referring to equations 1, 2 and 4, a maximum change in voltage $\Delta V_{ch,var}$ for the channel voltage $V_{ch}$, based on the charge injection, may be represented by:

$$\Delta V_{ch,var} = [(C_{OX} \times W \times L)/(2 \times C_{hold})] \times [A + \Gamma \times A^{1/2}] \quad \text{Equation 5}$$

Accordingly, as the gate-source voltage $V_{gs}$ and the threshold voltage $V_{th}$ vary in response to the input signal VIN, the maximum change in the channel voltage $\Delta V_{ch,var}$ may be varied based on the input signal VIN.

When an NMOS transistor operates in the linear region, a drain current $i_d$ of the NMOS transistor can be represented by the formula $i_d = K_n/2[2(V_{gs} - V_{th})V_{ds} - V_{ds}^2]$, and a channel conductance $G_{ds}$ can be represented by the formula $G_{ds} = (\partial i_d / \partial v_{ds}) \approx K_n \times (V_{gs} - V_{th})$, wherein $v_{ds}$ denotes a voltage between the drain and the source, $K_n$ denotes $\mu \times C_{OX} \times W/L$ and $\mu$ denotes an electron mobility. A maximum change in conductance $\Delta G_{ds,var}$ of the channel conductance $G_{ds}$ may be represented by:

$$\Delta G_{ds,var} = K_n \times [A + \Gamma \times A^{1/2}] \quad \text{Equation 6}$$

Accordingly, the maximum change in channel conductance $\Delta G_{ds,var}$, as well as the maximum change in channel conductance $\Delta V_{ch,var}$ may be varied depending on the input signal VIN, as the gate-source voltage $V_{gs}$ and the threshold voltage $V_{th}$ may vary in response to the input signal VIN.

SUMMARY OF THE INVENTION

Some embodiments of the present invention may provide a track-and-hold circuit that may reduce channel charge injection and/or channel conductance variation.

Other embodiments of the present invention may provide methods for operating a track-and-hold circuit that may reduce the channel charge injection and/or channel conductance variation.

In some embodiments, a track-and-hold circuit may include a first metal-oxide semiconductor (MOS) transistor, a hold capacitor, a first level shifter and a second level shifter.

The first MOS transistor may be configured to receive a level-shifted signal at an input terminal, and may sample the level-shifted signal based on a clock signal to output the sampled signal at an output terminal. The hold capacitor may be coupled to the output terminal, and may be configured to hold the sampled signal. The first level shifter may be configured to change or affect a voltage level of an analog input signal by as much as a first direct current (DC) voltage level to generate a switching signal, and may be configured to provide the switching signal to a gate of the first MOS transistor. The second level shifter may be configured to change or affect a voltage level of the analog input signal by as much as a second DC voltage level to generate the level-shifted signal, and may be configured to provide the level-shifted signal to the input terminal of the first MOS transistor.

The first and second level shifters may be configured to provide level-shifted signals by changing the voltage level of the analog input signal by as much as the first and second direct current (DC) voltage levels, respectively. Therefore, a gate-source voltage of the NMOS transistor may be maintained regardless of variation of the analog input signal.

In other embodiments, a track-and-hold circuit may include a first track-and-hold unit, a second track-and-hold unit and a differential buffer.

The first track-and-hold unit may include a first MOS transistor that may be configured to sample a first analog input signal based on a clock signal to output a first sampled signal at a first output terminal; a hold capacitor coupled to the first output terminal that may be configured to hold the first sampled signal; and a first level shifting section that may be configured to maintain a gate-source voltage of the first MOS transistor at a predetermined voltage.

The second track-and-hold unit may include a second MOS transistor that may be configured to sample a second analog input signal based on the clock signal to output a second sampled signal at a second output terminal; a hold capacitor coupled to the second output terminal that may be configured to hold the second sampled signal; and a second level shifting section that may be configured to maintain a gate-source voltage of the second MOS transistor at a predetermined voltage.

The differential buffer may be configured to buffer the first sampled signal and the second sampled signal to generate a differential output signal pair.

In still other embodiments, a method of performing a track-and-hold operation may include changing or offsetting an analog input signal by as much as a first DC voltage level to generate a first signal; changing or offsetting the analog input signal by as much as a second DC voltage level to generate a second signal; sampling the first signal in response to a clock signal and the second signal to generate a sampled signal; and holding the sampled signal.

According to some embodiments of the present invention, an electronic device includes a field effect transistor (FET), a capacitor, and a voltage offset circuit. The FET is configured to receive a signal at a first terminal thereof and selectively provide the signal to a second terminal thereof responsive to a switching signal at a gate terminal thereof. The capacitor is electrically connected to the second terminal of the FET The voltage offset circuit is electrically connected to the first terminal and the gate terminal of the FET. The voltage offset circuit is configured to maintain a substantially constant voltage differential between the first terminal and the gate terminal of the FET while the signal is provided to the second terminal of the FET and substantially independent of a voltage level of an input signal.

In some embodiments, the voltage offset circuit may be configured to maintain the substantially constant voltage differential between the first terminal and the gate terminal of the FET regardless of a voltage level of the signal at the first terminal thereof.

In other embodiments, the first and second terminals of the FET may respectively be source and drain terminals. The voltage offset circuit may include a first voltage offset circuit and a second voltage offset circuit. The first voltage offset circuit may be electrically connected to the gate terminal of the FET, and may be configured to offset a voltage level of an input signal by a first predetermined voltage level to provide the switching signal to the gate terminal. The second voltage offset circuit may be electrically connected to the source terminal of the FET, and may be configured to offset the voltage level of the input signal by a second predetermined voltage level to provide the signal to the source terminal.

In some embodiments, a voltage difference between the first and second predetermined voltage levels may be greater than a threshold voltage of the FET.

In other embodiments, the input signal may be an analog input signal, and the first and second predetermined voltage levels may be first and second DC offset voltages.

In some embodiments, the first voltage offset circuit may include a second FET and a third FET. The second FET may have source and drain terminals electrically connected between a first supply voltage and the gate terminal of the first FET, and may be configured to be controlled responsive to a first bias voltage at a gate terminal thereof. The third FET may have source and drain terminals electrically connected between the gate terminal of the first FET and a second supply voltage, and may be configured to be controlled responsive to the input signal at a gate terminal thereof.

In other embodiments, the second voltage offset circuit may include a fourth FET and a fifth FET. The fourth FET may have source and drain terminals electrically connected between the first supply voltage and the source terminal of the first FET, and may be configured to be controlled responsive to a second bias voltage at a gate terminal thereof. The fifth FET may have source and drain terminals electrically connected between the source terminal of the first FET and the second supply voltage, and may be configured to be controlled responsive to the input signal at a gate terminal thereof.

In some embodiments, the first voltage offset circuit may be configured to selectively provide the switching signal to the gate terminal of the FET responsive to a clock signal.

In other embodiments, the electronic device may include a gate control circuit. The gate control circuit may include a second FET having source and drain terminals electrically connected between the gate of the first FET and a supply voltage, and may be configured to selectively provide the switching signal responsive to the clock signal at a gate terminal of the second FET.

In some embodiments, a metal-oxide semiconductor (MOS) capacitor may be electrically connected between the drain terminal of the first FET and the gate terminal of the second FET.

In some embodiments, the FET may be a n-channel metal-oxide semiconductor FET, and the first predetermined voltage level may be greater than the second predetermined voltage level.

In other embodiments, the FET may be a p-channel metal-oxide semiconductor FET, and the first predetermined voltage level may be less than the second predetermined voltage level.

In some embodiments, the electronic device may include a first sample-and-hold circuit, a second sample-and-hold circuit, and a differential buffer electrically connected to the first and second sample-and-hold circuits. The first sample-and-hold circuit may include the first FET, the first capacitor, and the first voltage offset circuit, and may be configured to output a first sampled signal based on the first signal. The second sample and hold circuit may be configured to output a second sampled signal based on a second signal. The second sample and hold circuit may include a second FET, a second capacitor, and a second voltage offset circuit. The second FET may be configured to receive the second signal at a first terminal thereof and selectively provide the second signal to a second terminal thereof responsive to a second switching signal at a gate terminal thereof. The second capacitor may be electrically connected to the second terminal of the second FET. The second voltage offset circuit may be electrically connected to the first terminal and the gate terminal of the second FET, and may be configured to maintain a substantially constant voltage differential therebetween while the second signal is provided to the second terminal of the second FET. The differential buffer may be configured to provide a pair of differential output signals based on the first and second sampled signals.

In some embodiments, the first and second signals may be a pair of differential input signals offset by a predetermined voltage level.

According to other embodiments of the present invention, a method of operating an electronic device including a field effect transistor (FET) and a capacitor electrically connected thereto includes receiving a signal at a first terminal of the FET. The signal is selectively provided to a second terminal of the FET responsive to receiving a switching signal at a gate terminal of the FET. A substantially constant voltage differential is maintained between the first terminal and the gate terminal of the FET responsive to selectively providing the signal to the second terminal of the FET and substantially independent of a voltage level of an input signal.

In some embodiments, the first and second terminals of the FET may respectively be source and drain terminals. The substantially constant voltage differential between the source terminal and the gate terminal (i.e., the gate-source voltage) may be maintained by offsetting a voltage level of an input signal by a first predetermined voltage level to provide the switching signal to the gate terminal of the FET, and offsetting the voltage level of the input signal by a second predetermined voltage level to provide the signal to the source terminal of the FET.

According to further embodiments of the present invention, a sample-and-hold circuit includes a capacitor, a field effect transistor (FET), and a voltage offset circuit. The FET includes a source terminal configured to receive a signal, a drain terminal electrically connected to the capacitor, and a gate terminal. The FET is configured to selectively connect the capacitor to the signal during a sampling operation and disconnect the capacitor from the signal during a hold operation responsive to a switching signal at the gate terminal. The voltage offset circuit is electrically connected to the source terminal and the gate terminal of the FET, and configured to maintain a substantially constant gate-source voltage during the sampling operation and independent of the voltage level of an analog input signal.

In some embodiments, the voltage offset circuit may include first and second voltage offset circuits. The first voltage offset circuit may be electrically connected to the gate terminal of the FET, and may be configured to offset a voltage level of the analog input signal by a first predetermined voltage level to provide the switching signal to the gate terminal during the sampling operation. The second voltage offset circuit may be electrically connected to the source terminal of the FET, and may be configured to offset the voltage level of the analog input signal by a second predetermined voltage level to provide the signal to the source terminal and thereby maintain the substantially constant gate-source voltage.

DETAILED DESCRIPTION OF EMBODIMENTS OF THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of elements and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application and will not be interpreted in an idealized or overly formal sense unless expressly so defined herein.

Figure 2:
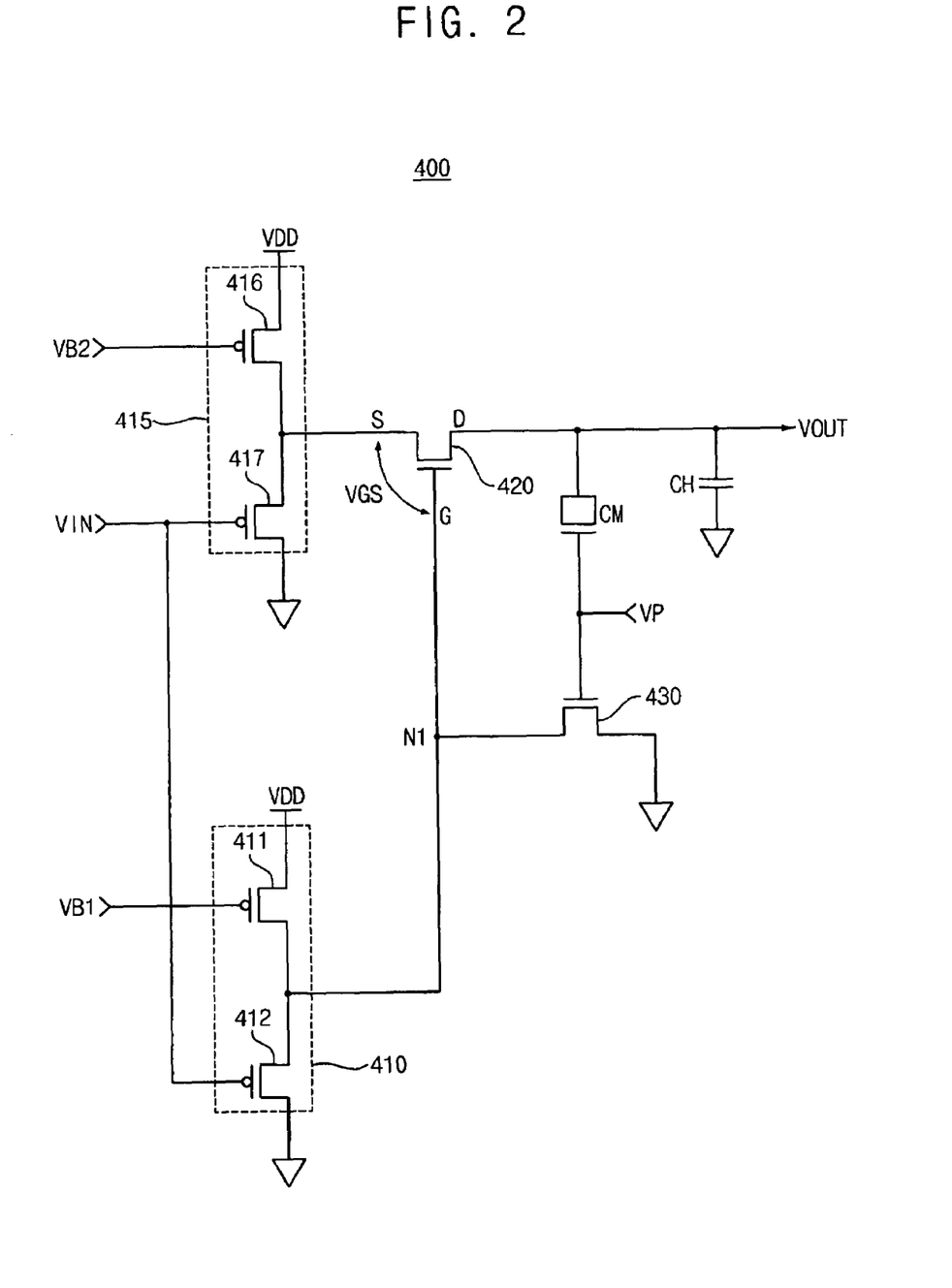
FIG. 2 is a circuit diagram illustrating a track-and-hold circuit according to example embodiments of the present invention.

FIG. 2 is a circuit diagram illustrating a track-and-hold circuit according to some embodiments of the present invention. Referring now to FIG. 2, the track-and-hold circuit (also referred to herein as a sample-and-hold circuit) 400 includes an NMOS transistor 420, a hold capacitor CH, a first level shifter (also referred to herein as a first voltage offset circuit) 410, and a second level shifter (also referred to herein as a second voltage offset circuit) 415.

The first level shifter 410 is configured to add a direct current (DC) offset voltage having a first DC voltage level to the analog input signal VIN, and thereby provides a switching signal to a gate of the NMOS transistor 420. The second level shifter 415 is configured to add a DC offset voltage having a second DC voltage level to the analog input signal VIN. The NMOS transistor 420 receives the output signal of the second level shifter 415, samples the output signal of the second level shifter 415 based on a clock signal VP, and provides the sampled signal to an output terminal of the track-and-hold circuit 400. The hold capacitor CH is coupled between the output terminal of the track-and-hold circuit 400 and a ground voltage so as to hold the sampled voltage.

The first level shifter 410 includes p-channel metal-oxide semiconductor (PMOS) transistors 411 and 412. The PMOS transistor 411 is coupled between a power supply voltage VDD and a node N1, and is controlled (i.e., turned on and off) based on a first bias voltage VB1. The PMOS transistor 412 is coupled between the ground voltage and the node N1, and is controlled based on the analog input signal VIN.

The second level shifter 415 includes PMOS transistors 416 and 417. The PMOS transistor 416 is coupled between the power supply voltage VDD and a source S of the NMOS transistor 420 and is controlled (i.e., turned on and off) based on a second bias voltage VB2. The PMOS transistor 417 is coupled between the ground voltage and the source S of the NMOS transistor 420, and is controlled based on the analog input signal VIN.

The track-and-hold circuit 400 also includes an NMOS transistor 430 configured to control a gate G of the NMOS transistor 420 in response to the clock signal VP. The track-and-hold circuit 400 further includes a MOS capacitor CM that has a first terminal connected to a drain D of the NMOS transistor 420 (i.e., the output terminal of the track-and-hold circuit 400), and a second terminal connected to the clock signal VP.

Hereinafter, the operation of the track-and-hold circuit 400 in FIG. 2 will be described in greater detail. More particularly, the track-and-hold circuit 400 is configured to sample the received analog input signal VIN at discrete time intervals to generate a sampled signal VOUT. The source S of the NMOS transistor 420 is provided with the input signal VIN plus the second DC voltage level. In other words, the input voltage VIN is offset by a predetermined voltage level and is provided to the source terminal S of the NMOS transistor 420.

When the clock signal VP is provided at a logic 'low' level, the NMOS transistor 430 is turned off, and thus a voltage level of the node N1 is dependent on the output signal of the first level shifter 410. As such, the NMOS transistor 420 is turned on, and the output signal of the second level shifter 415 is transmitted to the output terminal of the track-and-hold circuit 400. When the clock signal VP transitions to a logic 'high' level from a logic 'low' level, the node N1 is at a logic 'low' level, and the NMOS transistor 420 is turned off. With the NMOS transistor 420 in the off-state, electric charges, which may accumulate under a lower channel of the gate G of the NMOS transistor 420, may be transferred to the hold capacitor CH. In other words, when the NMOS transistor 420 is turned on and then turned off, channel charge injection may occur, which may result in parasitic (i.e., leakage) current.

In a conventional track-and-hold circuit as shown in FIG. 1, the channel voltage level and the channel conductance may be varied due to channel charge injection, and based on the voltage level of the analog input signal VIN.

Accordingly, the track-and-hold circuit 400 according to some embodiments of the present invention as shown in FIG. 2 includes the first level shifter/voltage offset circuit 410 and the second level shifter/voltage offset circuit 415. More particularly, the second level shifter 415 is configured to provide the source of the NMOS transistor 420 with the analog input signal plus an offset voltage corresponding to the second DC voltage level, and the first level shifter 410 is configured to provide the gate of the NMOS transistor 420 with the analog input signal plus an offset voltage corresponding to the first DC voltage level, so as to reduce variations in the channel voltage and/or the channel conductance of the NMOS transistor 420 with respect to the analog input signal VIN. As described above, the variations in the channel voltage and the channel conductance of the NMOS transistor may be dependent on the gate-source voltage VGS and the threshold voltage $V_{th}$. As such, the track-and-hold circuit 400 is configured to maintain a substantially constant gate-source voltage VGS regardless and/or substantially independent of the analog input signal.

Still referring to FIG. 2, when the NMOS transistor 430 is turned off, the voltage level of the node N1, that is, an output of the first level shifter 410, is equal to the sum of the first DC offset voltage level and the analog input signal VIN. Thus, the NMOS transistor 420 is turned on, and the source S of the NMOS transistor 420 is provided with the sum of the second DC offset voltage level and the analog input signal VIN. As such, the gate-source voltage of the NMOS transistor 420 is equal to a difference between the DC voltage provided by the first level shifter 410 and the DC voltage provided by the second level shifter 415. Accordingly, the gate-source voltage of transistor 420 may be maintained at a substantially constant voltage even though the analog input signal VIN may vary. Because the gate-source voltage VGS of the NMOS transistor 420 may be substantially maintained regardless of variation in the analog input signal VIN, variations in the channel voltage and/or the channel conductance can be reduced considerably.

In the track-and-hold circuit 400 of FIG. 2, when the clock signal is at a logic 'low' (that is, when the clock signal is disabled), the NMOS transistor 430 is turned off, and the gate G of the NMOS transistor 420 is provided with a switching signal (i.e., the output signal of the first level shifter 410). To turn on the NMOS transistor 420, the gate-source voltage VGS of the NMOS transistor 420 should be greater than the threshold voltage $V_{th}$ of the NMOS transistor 420. However, as noted above, the gate-source voltage VGS of the NMOS transistor 420 when the clock signal VP at a logic 'low' is equal to a voltage difference between the output of the second level shifter 415 and the output of the first level shifter 410. Therefore, the voltage difference between the output of the first level shifter 410 and the output of the second level shifter 415 should be greater than the threshold voltage $V_{th}$ of the NMOS transistor 420. In other words, the voltage difference between the DC offset voltage provided by the first level shifter 410 and the DC offset voltage provided by the second level shifter 415 should be greater than the threshold voltage $V_{th}$ of the NMOS transistor 420.

The MOS capacitor CM, in the track-and-hold circuit 400 in FIG. 2 may absorb electric charges, which may be injected from the drain D of the NMOS transistor 420 to the hold capacitor CH when the NMOS transistor 420 is turned off. Thus, the MOS capacitor CM may reduce distortion of the sampled voltage VOUT caused by turning the NMOS transistor 420 on and off, i.e., due to the transition between the on and off states.

Figure 3:
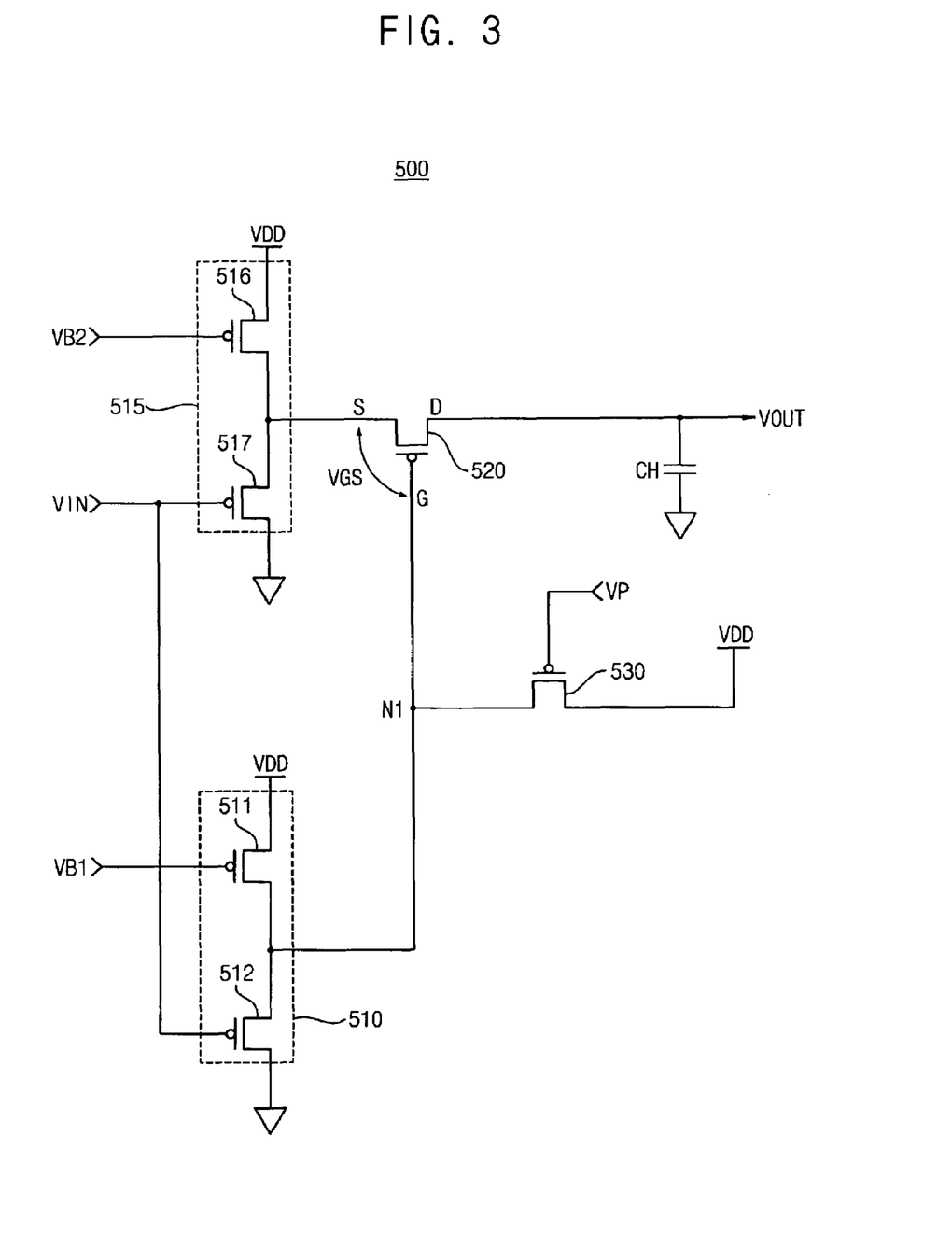
FIG. 3 is a circuit diagram illustrating a track-and-hold circuit according to other embodiments of the present invention.

FIG. 3 is a circuit diagram illustrating a track-and-hold circuit according to other embodiments of the present invention. Referring now to FIG. 3, the track-and-hold circuit 500 includes a PMOS transistor 520, a hold capacitor CH, a first level shifter/voltage offset circuit 510 and a second level shifter/voltage offset circuit 515.

The first level shifter 510 adds a DC offset voltage having a first DC voltage level to the analog input signal VIN, and thereby provides a switching signal to a gate of the PMOS transistor 520. The second level shifter 515 adds a DC offset voltage having a second DC voltage level to the analog input signal VIN. The PMOS transistor 520 receives an output signal of the second level shifter 515, samples the output signal based on a clock signal VP, and provides the sampled signal to an output terminal of the track-and-hold circuit 500. The hold capacitor CH is coupled between the output terminal of the track-and-hold circuit 500 and a ground voltage, so as to hold the sampled voltage.

The first level shifter 510 includes PMOS transistors 511 and 512. The PMOS transistor 511 is coupled between a power supply voltage VDD and a node N1, and is controlled based on a first bias voltage VB1. The PMOS transistor 512 is coupled between the ground voltage and the node N1, and is controlled based on the analog input signal VIN.

The second level shifter 515 includes PMOS transistors 516 and 517. The PMOS transistor 516 is coupled between the power supply voltage VDD and a source S of the PMOS transistor 520, and is controlled based on a second bias voltage VB2. The PMOS transistor 517 is coupled between the ground voltage and the source S of the PMOS transistor 520, and is controlled based on the analog input signal VIN.

The track-and-hold circuit 500 further includes a PMOS transistor 530 to control a gate G of the PMOS transistor 520 in response to the clock signal VP. When the clock signal VP is at a logic 'low' (that is, when the clock signal is disabled), the PMOS transistor 530 is turned on, and the node N1 is electrically connected to the power supply voltage VDD. As such, the PMOS transistor 520 is turned off.

However, in the track-and-hold circuit 500 in FIG. 3, when the clock signal is at a logic 'high' (that is, when the clock signal VP is enabled), the PMOS transistor 530 is turned off, and the gate G of the PMOS transistor 520 is provided with the output signal from the first level shifter 510. To turn on the PMOS transistor 520, the gate-source voltage VGS of the PMOS transistor 520 should be greater than the threshold voltage $V_{th}$ of the PMOS transistor 520. However, the gate-source voltage VGS of the PMOS transistor 520, with the clock signal VP at a logic 'high', is equal to a voltage difference between the output of the second level shifter 515 and the output of the first level shifter 510. Therefore, the voltage difference between the output of the first level shifter 510 and the output of the second level shifter 515 should be greater than the threshold voltage $V_{th}$ of the PMOS transistor 520.

The operation of the track-and-hold circuit 500 in FIG. 3 is substantially similar to the track-and-hold circuit 400 of FIG. 2, and as such, further description thereof will not be provided.

Figure 4:
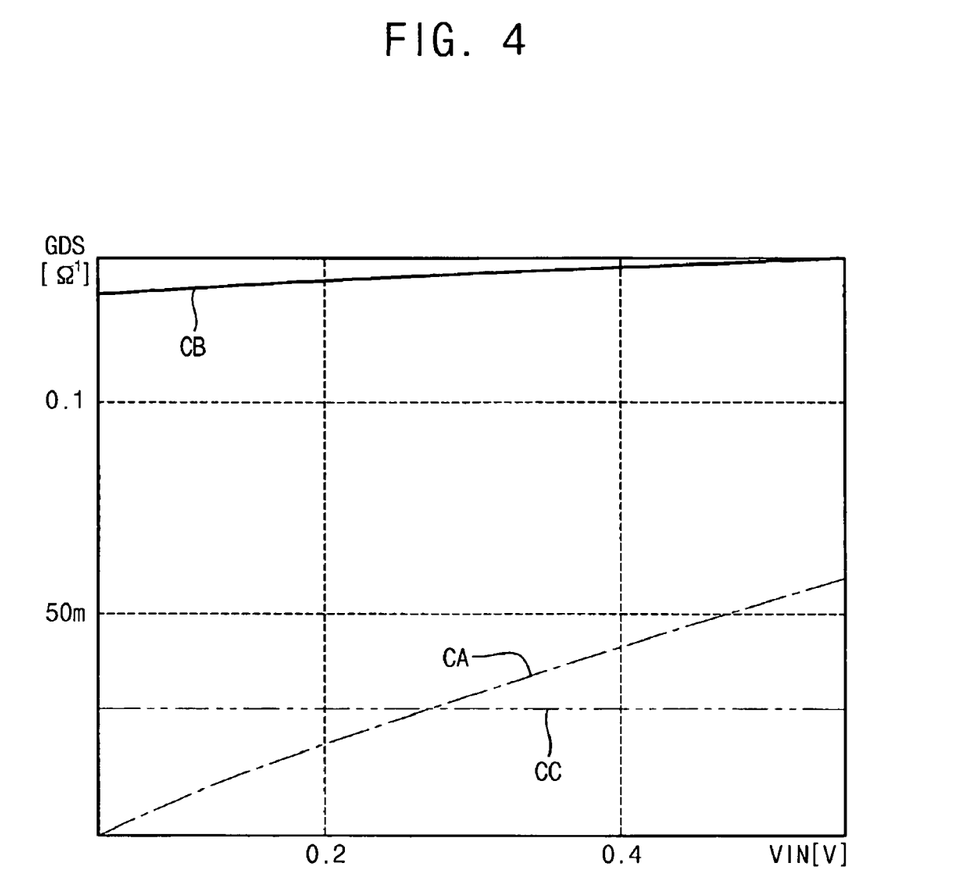
FIG. 4 is a graph illustrating changes in the channel conductance responsive to an input signal in conventional track-and-hold circuits as compared to track-and-hold circuits according to some embodiments of the present invention.

FIG. 4 is a graph illustrating changes in the channel conductance responsive to an input signal in conventional track-and-hold circuits as compared to track-and-hold circuits according to some embodiments of the present invention. In FIG. 4, line CA corresponds to the conventional track-and-hold circuit of FIG. 1, while line CB corresponds to the track-and-hold circuit according to some embodiments of the present invention as shown in FIG. 2, and line CC corresponds to the track-and-hold circuit according to other embodiments of the present invention as shown FIG. 3. The channel conductance shown by line CA varies in a range of about 1.172 m$\Omega^{-1}$ to about 59.316 m$\Omega^{-1}$, the channel conductance shown by line CB varies in a range of about 124.48 m$\Omega^{-1}$ to about 132.27 m$\Omega^{-1}$, and the channel conductance shown by line CC varies in a range of about 29.276 m$\Omega^{-1}$ to about 29.582 m$\Omega^{-1}$.

In other words, the variations in channel conductance illustrated in FIG. 4 may be ordered such that CC<CB<CA. Accordingly, the track-and-hold circuit corresponding to line CC offers the least variation in channel conductance.

The track-and-hold circuit corresponding to line CC and FIG. 3, uses a PMOS transistor as a switch, and thus may offer relatively good performance when the sampling frequencies are relatively low. On the other hand, the track-and-hold circuit corresponding to FIG. 2 uses an NMOS transistor as a switch, and as such, may be more suitable for use when the sampling frequencies are relatively high.

Figure 5:
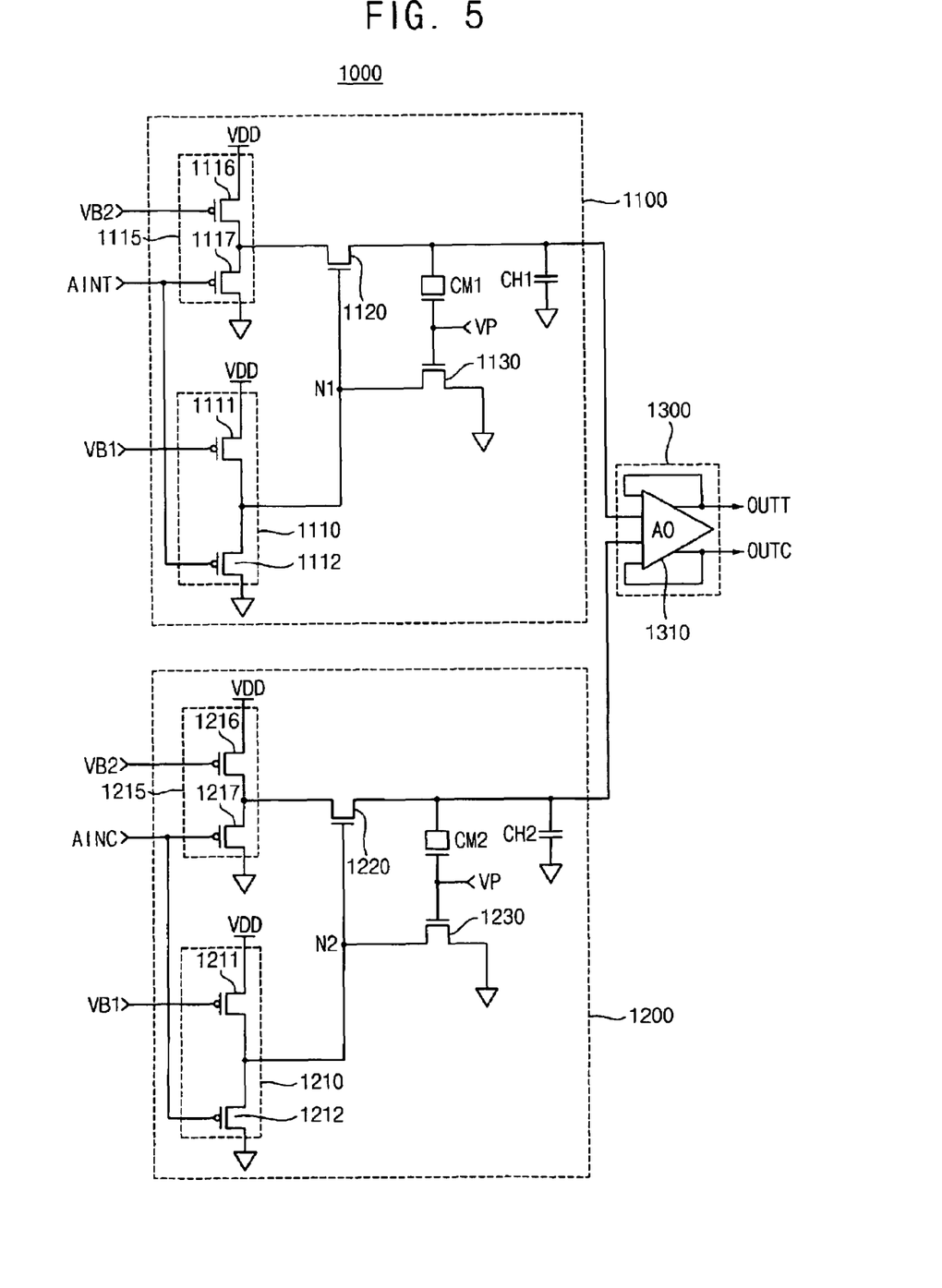
FIG. 5 is a circuit diagram illustrating a track-and-hold circuit according to further embodiments of the present invention.

FIG. 5 is a circuit diagram illustrating a track-and-hold circuit according to further embodiments of the present invention. The track-and-hold circuit 1000 in FIG. 5 includes two track-and-hold circuits as illustrated in FIG. 2, which respectively receive differential input signals AINT and AINC and respectively execute sampling operations thereon. The sampled signals from the two differential track-and-hold circuits are buffered and generated as a pair of differential output signals OUTT and OUTC through a pseudo-differential buffer 1300.

More particularly, the track-and-hold circuit 1000 includes a first track-and-hold unit 1100, a second track-and-hold unit 1200, and a differential buffer 1300. The first track-and-hold unit 1100 maintains a substantially constant gate-source voltage for an MOS transistor 1120, so as to reduce channel charge injection and/or variation in channel conductance. As such, the first track-and-hold unit 1100 samples a first analog input signal AINT in response to a clock signal VP to generate a first sampled signal.

The second track-and-hold unit 1200 maintains a substantially constant gate-source voltage for an MOS transistor 1220, so as to reduce channel charge injection and/or variation in channel conductance. Likewise, the second track-and-hold unit 1200 samples a second analog input signal AINC in response to a clock signal VP to generate a second sampled signal.

The differential buffer 1300 may be a pseudo-differential buffer configured to buffer the first and second sampled signals to generate the differential output signal pair. The differential buffer 1300 includes a differential amplifier 1310 having a unity-gain. Among the four input terminals of the differential amplifier 1310, two input terminals respectively receive an output signal of the first track-and-hold unit 1100 and an output signal of the second track-and-hold unit 1200. The other two terminals of the differential amplifier 1310 are respectively connected to the two output terminals of the differential amplifier 1310.

The track-and-hold circuit 1000 as shown in FIG. 5 uses the unity-gain pseudo-differential buffer, which receives a pair of differential input signals to be sampled, and outputs a pair of differential output signals. For example, the track-and-hold circuit 1000 may be used in systems having a sampling speed lower than 100 MHz.

As described above, track-and-hold circuits according to the embodiments of the present invention include a level shifter or voltage offset circuit that is configured to substantially maintain the gate-source voltage of the MOS transistor switch at a predetermined voltage level that is greater than its threshold voltage, so that channel charge injection and/or variation in channel conductance may be reduced regardless and/or substantially independent of variation in the input signal. In addition, the track-and-hold circuit may be configured to prevent the sampled signal from being distorted.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. An electronic device, comprising:
    a field effect transistor (FET) configured to receive a signal at a source terminal thereof and selectively provide the signal to a drain terminal thereof responsive to a switching signal at a gate terminal thereof;
    a capacitor electrically connected to the drain terminal of the FET; and
    a voltage offset circuit electrically connected to the source terminal and the gate terminal of the FET and configured to maintain a substantially constant voltage differential therebetween while the signal is provided to the drain terminal of the FET and substantially independent of a voltage level of an input signal, wherein the voltage offset circuit comprises:
        a first voltage offset circuit electrically connected to the gate terminal of the FET and configured to offset a voltage level of the input signal by a first predetermined voltage level to provide the switching signal to the gate terminal; and
        a second voltage offset circuit electrically connected to the source terminal of the FET and configured to offset the voltage level of the input signal by a second predetermined voltage level to provide the signal to the source terminal.

2. The device of claim 1, wherein a voltage difference between the first and second predetermined voltage levels is greater than a threshold voltage of the FET, responsive to the switching signal.

3. The device of claim 1, wherein the input signal comprises an analog input signal, and wherein the first and second predetermined voltage levels comprise first and second DC offset voltages.

4. The device of claim 1, wherein the FET comprises a first FET, and wherein the first voltage offset circuit comprises:
    a second FET having source and drain terminals electrically connected between a first supply voltage and the gate terminal of the first FET and configured to be controlled responsive to a first bias voltage at a gate terminal thereof; and
    a third FET having source and drain terminals electrically connected between the gate terminal of the first FET and a second supply voltage and configured to be controlled responsive to the input signal at a gate terminal thereof.

5. The device of claim 4, wherein the second voltage offset circuit comprises:
    a fourth FET having source and drain terminals electrically connected between the first supply voltage and the source terminal of the first FET and configured to be controlled responsive to a second bias voltage at a gate terminal thereof; and
    a fifth FET having source and drain terminals electrically connected between the source terminal of the first FET and the second supply voltage and configured to be controlled responsive to the input signal at a gate terminal thereof.

6. The device of claim 1, wherein the first voltage offset circuit is configured to selectively provide the switching signal to the gate terminal of the FET responsive to a clock signal.

7. The device of claim 6, wherein the FET comprises a first FET, and further comprising:
    a gate control circuit comprising a second FET having source and drain terminals electrically connected between the gate of the first FET and a supply voltage and configured to selectively provide the switching signal responsive to the clock signal at a gate terminal of the second VET.

8. The device of claim 7, further comprising:
    a metal-oxide semiconductor (MOS) capacitor electrically connected between the drain terminal of the first FET and the gate terminal of the second FET.

9. The device of claim 1, wherein the FET comprises a n-channel metal-oxide semiconductor FET, and wherein the first predetermined voltage level is greater than the second predetermined voltage level, responsive to the switching signal.

10. The device of claim 1, wherein the FET comprises a p-channel metal-oxide semiconductor FET, and wherein the first predetermined voltage level is less than the second predetermined voltage level, responsive to the switching signal.

11. The device of claim 1, wherein the FET comprises a first FET, wherein the capacitor comprises a first capacitor, wherein the voltage offset circuit comprises a first voltage offset circuit, and wherein the signal comprises a first signal, and further comprising:

a first sample-and-hold circuit comprising the first FET, the first capacitor, and the first voltage offset circuit and configured to output a first sampled signal based on the first signal;

a second sample-and-hold circuit configured to output a second sampled signal based on a second signal, the second sample and hold circuit comprising:

a second FET configured to receive the second signal at a first terminal thereof and selectively provide the second signal to a second terminal thereof responsive to a second switching signal at a gate terminal thereof;

a second capacitor electrically connected to the second terminal of the second FET; and a second voltage offset circuit electrically connected to the first terminal and the gate terminal of the second FET and configured to maintain a substantially constant voltage differential therebetween while the second signal is provided to the second terminal of the second FET; and a differential buffer electrically connected to the first and second sample-and-hold circuits and configured to provide a pair of differential output signals based on the first and second sampled signals.

12. The device of claim 11, wherein the first and second signals comprise a pair of differential input signals offset by a predetermined voltage level.

13. A method of operating an electronic device including a field effect transistor (FET) and a capacitor electrically connected thereto, the method comprising:

receiving a signal at a source terminal of the FET;

selectively providing the signal to a drain terminal of the FET responsive to receiving a switching signal at a gate terminal of the FET; and maintaining a substantially constant voltage differential between the source terminal and the gate terminal of the FET responsive to selectively providing the signal to the drain terminal of the FET and substantially independent of a voltage level of an input signal, wherein maintaining the substantially constant voltage differential comprises:

offsetting a voltage level of the input signal by a first predetermined voltage level to provide the switching signal to the gate terminal of the FET; and offsetting the voltage level of the input signal by a second predetermined voltage level to provide the signal to the source terminal of the FET.

14. The method of claim 13 wherein a voltage difference between the first and second predetermined voltage levels is greater than a threshold voltage of the FET.

15. A sample-and-hold circuit, comprising:

a capacitor;

a field effect transistor (FET) including a source terminal configured to receive a signal, a drain terminal electrically connected to the capacitor, and a gate terminal, wherein the FET is configured to selectively connect the capacitor to the signal during a sampling operation and disconnect the capacitor from the signal during a hold operation responsive to a switching signal at the gate terminal; and a voltage offset circuit electrically connected to the source terminal and the gate terminal of the FET and configured to maintain a substantially constant gate-source voltage during the sampling operation and independent of the voltage level of an analog input signal, wherein the voltage offset circuit comprises:

a first voltage offset circuit electrically connected to the gate terminal of the FET and configured to offset a voltage level of the analog input signal by a first predetermined voltage level to provide the switching signal to the gate terminal during the sampling operation; and a second voltage offset circuit electrically connected to the source terminal of the FET and configured to offset the voltage level of the analog input signal by a second predetermined voltage level to provide the signal to the source terminal and thereby maintain the substantially constant gate-source voltage.

* * * * *

UNITED STATES PATENT AND TRADEMARK OFFICE
CERTIFICATE OF CORRECTION

PATENT NO. : 7,385,427 B2  Page 1 of 1
APPLICATION NO. : 11/443730
DATED : June 10, 2008
INVENTOR(S) : Lim It is certified that error appears in the above-identified patent and that said Letters Patent is hereby corrected as shown below:

Column 12, Claim 7, Line 47:  Please correct "VET"
To read -- FET --

Signed and Sealed this

Twenty-sixth Day of August, 2008

JON W. DUDAS
*Director of the United States Patent and Trademark Office*